(12) United States Patent
Cho (10) Patent No.: US 9,773,530 B1
(45) Date of Patent: Sep. 26, 2017

(54) SEMICONDUCTOR DEVICES AND SEMICONDUCTOR SYSTEMS RELATING TO THE PREVENTION OF A POTENTIAL DIFFERENCE BETWEEN SIGNALS FROM BEING REVERSED

(71) Applicant: SK hynix Inc., Icheon-si, Gyeonggi-do (KR)

(72) Inventor: Sun Ki Cho, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/232,196

(22) Filed: Aug. 9, 2016

(30) Foreign Application Priority Data

Apr. 21, 2016 (KR) .................. 10-2016-0048855

(51) Int. Cl.
*H03L 7/00* (2006.01)
*G11C 7/10* (2006.01)
*G11C 29/02* (2006.01)

(52) U.S. Cl.
CPC .......... *G11C 7/1066* (2013.01); *G11C 7/1057* (2013.01); *G11C 29/022* (2013.01); *G11C 29/023* (2013.01); *G11C 29/028* (2013.01)

(58) Field of Classification Search
CPC ... G11C 7/1066; G11C 29/022; G11C 7/1057; G11C 29/023; G11C 29/028
See application file for complete search history.

(56) References Cited

U.S. PATENT DOCUMENTS 7,715,253 B2 * 5/2010 Kim .................... G11C 7/1051
365/193
2013/0010546 A1 1/2013 Wang et al.

FOREIGN PATENT DOCUMENTS

KR 1020140111494 A 9/2014

* cited by examiner

*Primary Examiner* — Kenneth B Wells
(74) *Attorney, Agent, or Firm* — William Park & Associates Ltd.

(57) ABSTRACT

A semiconductor device may be provided. The semiconductor device may be configured to adjust a level of a first strobe signal to a predetermined level during a first time period. The semiconductor device may be configured to adjust a swing width of the first strobe signal during a second time period.

22 Claims, 9 Drawing Sheets

FIG. 2

| TM<1> | TM<2> | SW<1> | SW<2> | SW<3> | SW<4> |
|---|---|---|---|---|---|
| L | L | H | L | L | L |
| H | L | H | H | L | L |
| L | H | H | H | H | L |
| H | H | H | H | H | H |

FIG. 3

| TM<3> | TM<4> | SW<5> | SW<6> | SW<7> | SW<8> |
|---|---|---|---|---|---|
| L | L | H | L | L | L |
| H | L | H | H | L | L |
| L | H | H | H | H | L |
| H | H | H | H | H | H |

FIG. 9

SEMICONDUCTOR DEVICES AND SEMICONDUCTOR SYSTEMS RELATING TO THE PREVENTION OF A POTENTIAL DIFFERENCE BETWEEN SIGNALS FROM BEING REVERSED

CROSS-REFERENCE TO RELATED APPLICATIONS

The present application claims priority under 35 U.S.C 119(a) to Korean Patent Application No. 10-2016-0048855, filed on Apr. 21, 2016, which is incorporated herein by reference in its entirety.

BACKGROUND

1. Technical Field

Embodiments of the present disclosure may generally relate to semiconductor devices relating to the prevention of a potential difference between signals from being reversed, and semiconductor systems including the semiconductor devices.

2. Related Art

Generally, a semiconductor device such as a dynamic random access memory (DRAM) may receive data from a chipset (for example, controller) to store the data therein during a write operation. Also, the semiconductor device may output the stored data to the chipset during a read operation. Meanwhile, in a synchronous semiconductor system, both a chipset and a memory may operate in synchronization with a system clock signal. However, when the data is outputted from the chipset to the memory, a skew between the data and the system clock signal may occur. This skew occurs because the loading and trace of the system clock signal are different from those of the data and distances between the chipset and a plurality of memories which are different from each other if the semiconductor system includes the plurality of memories.

In order to reduce the skew between the data and the system clock signal, when the data is outputted from the chipset to the memory, the data may be outputted together with a data strobe signal DQS. The data strobe signal DQS is what is called an echo clock and has the same loading and trace as the data. Accordingly, if the memory performs strobing of the data using the data strobe signal, it may be possible to minimize the skew that occurs due to the loading difference and the trace difference between the system clock signal and the data.

SUMMARY

According to an embodiment, a semiconductor system may be provided. According to an embodiment, a semiconductor device may be provided. The semiconductor device may be configured to adjust a level of a first strobe signal to a predetermined level during a first time period. The semiconductor device may be configured to adjust a swing width of the first strobe signal during a second time period.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
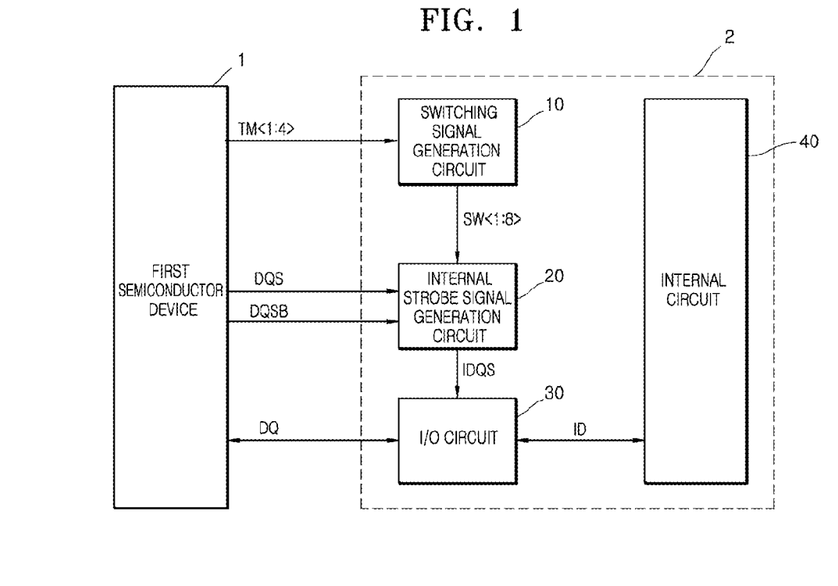
FIG. 1 is a block diagram illustrating an example of a representation of a configuration of a semiconductor system according to an embodiment of the present disclosure.

Referring to FIG. 1, a semiconductor system according to an embodiment of the present disclosure may include a first semiconductor device 1 and a second semiconductor device 2. The second semiconductor device 2 may include a switching signal generation circuit 10, an internal strobe signal generation circuit 20, an input and output (I/O) circuit 30, and an internal circuit 40.

The first semiconductor device 1 may output first to fourth test signals TM<1:4>, a first strobe signal DQS, and a second strobe signal DQSB. The first semiconductor device 1 may input or output data DQ. The first to fourth test signals TM<1:4> may be set to be signals for setting a level and a swing width of the first strobe signal DQS or the second strobe signal DQSB. The first and second test signals TM<1:2> may be set to be signals for setting an upper limit of a logic high level of the first strobe signal DQS or the second strobe signal DQSB. The third and fourth test signals TM<3:4> may be set to be signals for setting a lower limit of a logic low level of the first strobe signal DQS or the second strobe signal DQSB. The first strobe signal DQS and the second strobe signal DQSB may be set to be signals which do not toggle during a first time period but toggle during a second time period. That is, the first time period may be set to be a time period in which the first strobe signal DQS and the second strobe signal DQSB do not toggle, and the second time period may be set to be a time period in which the first strobe signal DQS and the second strobe signal DQSB toggle. The first strobe signal DQS and the second strobe signal DQSB may be set to be signals having opposite phases to each other during the second time period. Lines through which the first strobe signal DQS and the second strobe signal DQSB are transmitted may be set to have the same loading and trace or substantially the same loading and trace as a line through which the data DQ are inputted or outputted. Operations of adjusting the level and the swing width of the first strobe signal DQS or the second strobe signal DQSB will be described later.

The switching signal generation circuit 10 may decode the first to fourth test signals TM<1:4> to generate first to eighth switching signals SW<1:8>. The switching signal generation circuit 10 may be realized using a general decoder according to the embodiments.

The internal strobe signal generation circuit 20 may adjust a level of the first strobe signal DQS or the second strobe signal DQSB to a predetermined level in response to the first to eighth switching signals SW<1:8> during the first time period. The internal strobe signal generation circuit 20 may adjust a swing width of the first strobe signal DQS or the second strobe signal DQSB in response to the first to eighth switching signals SW<1:8> during the second time period. The internal strobe signal generation circuit 20 may compare the first strobe signal DQS with the second strobe signal DQSB to generate an internal strobe signal IDQS.

The I/O circuit 30 may latch the data DQ to generate internal data ID in synchronization with the internal strobe signal IDQS during a write operation or may latch the internal data ID to output the latched internal data as the data DQ in synchronization with the internal strobe signal IDQS during a read operation.

The internal circuit 40 may store the internal data ID during the write operation. The internal circuit 40 may output the internal data ID during the read operation. The internal circuit 40 may be realized using a general memory circuit.

The second semiconductor device 2 having an aforementioned configuration may adjust the level of the first strobe signal DQS or the second strobe signal DQSB to a predetermined level in response to the first to fourth test signals TM<1:4> during the first time period, may adjust the swing width of the first strobe signal DQS or the second strobe signal DQSB in response to the first to fourth test signals TM<1:4> during the second time period, and may receive or output the data DQ in synchronization with the internal strobe signal IDQS which is generated by comparing the first strobe signal DQS with the second strobe signal DQSB during the second time period.

Figure 2:
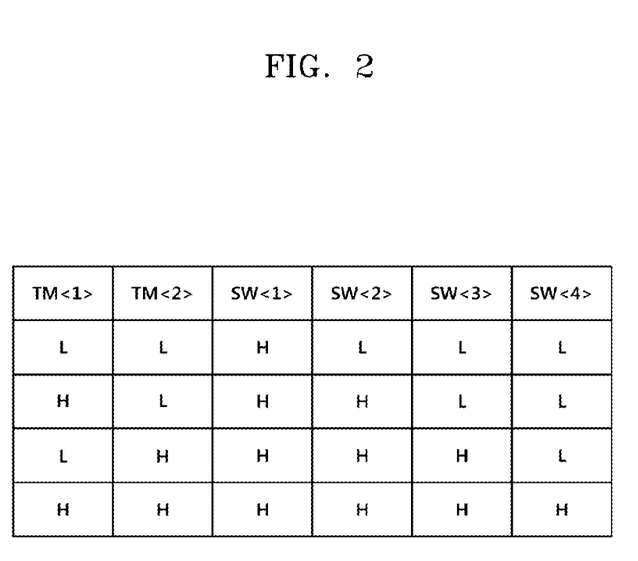
FIGS. 2 and 3 are tables illustrating an example of an operation of a switching signal generation circuit included in the semiconductor system of FIG. 1.

An operation of the switching signal generation circuit 10 that decodes the first and second test signals TM<1:2> to generate the first to fourth switching signals SW<1:4> will be described hereinafter with reference to FIG. 2. Further, the logic levels of the signals may be different from or the opposite of those described. For example, a signal described as having a logic "high" level may alternatively have a logic "low" level, and a signal described as having a logic "low" level may alternatively have a logic "high" level.

The switching signal generation circuit 10 may generate the first switching signal SW<1> having a logic high (H) level, the second switching signal SW<2> having a logic low (L) level, the third switching signal SW<3> having a logic low (L) level and the fourth switching signal SW<4> having a logic low (L) level, if the first test signal TM<1> has a logic low (L) level and the second test signal TM<2> has a logic low (L) level.

The switching signal generation circuit 10 may generate the first switching signal SW<1> having a logic high (H) level, the second switching signal SW<2> having a logic high (H) level, the third switching signal SW<3> having a logic low (L) level and the fourth switching signal SW<4> having a logic low (L) level, if the first test signal TM<1> has a logic high (H) level and the second test signal TM<2> has a logic low (L) level.

The switching signal generation circuit 10 may generate the first switching signal SW<1> having a logic high (H) level, the second switching signal SW<2> having a logic high (H) level, the third switching signal SW<3> having a logic high (H) level and the fourth switching signal SW<4> having a logic low (L) level, if the first test signal TM<1> has a logic low (L) level and the second test signal TM<2> has a logic high (H) level.

The switching signal generation circuit 10 may generate the first switching signal SW<1> having a logic high (H) level, the second switching signal SW<2> having a logic high (H) level, the third switching signal SW<3> having a logic high (H) level and the fourth switching signal SW<4> having a logic high (H) level, if the first test signal TM<1> has a logic high (H) level and the second test signal TM<2> has a logic high (H) level.

Figure 3:
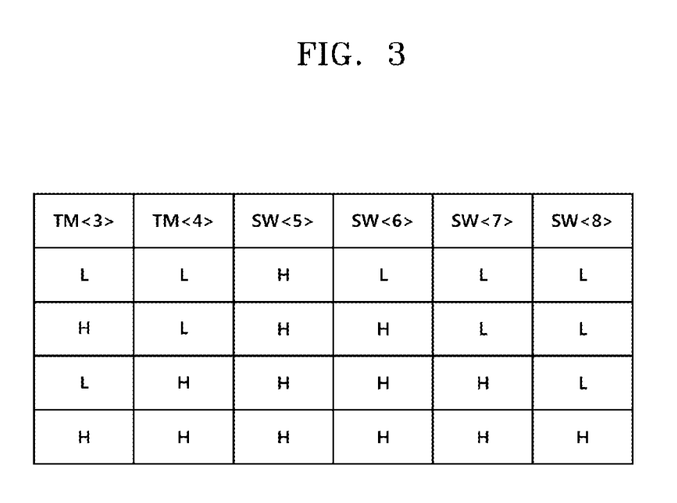

An operation of the switching signal generation circuit 10 that decodes the third and fourth test signals TM<3:4> to generate the fifth to eighth switching signals SW<5:8> will be described hereinafter with reference to FIG. 3. Further, the logic levels of the signals may be different from or the opposite of those described. For example, a signal described as having a logic "high" level may alternatively have a logic "low" level, and a signal described as having a logic "low" level may alternatively have a logic "high" level.

The switching signal generation circuit 10 may generate the fifth switching signal SW<5> having a logic high (H) level, the sixth switching signal SW<6> having a logic low (L) level, the seventh switching signal SW<7> having a logic (L) low level and the eighth switching signal SW<8> having a logic low (L) level, if the third test signal TM<3> has a logic low (L) level and the fourth test signal TM<4> has a logic low (L) level.

The switching signal generation circuit 10 may generate the fifth switching signal SW<5> having a logic high (H) level, the sixth switching signal SW<6> having a logic high (H) level, the seventh switching signal SW<7> having a logic low (L) level and the eighth switching signal SW<8> having a logic low (L) level, if the third test signal TM<3> has a logic high (H) level and the fourth test signal TM<4> has a logic low (L) level.

The switching signal generation circuit 10 may generate the fifth switching signal SW<5> having a logic high (H) level, the sixth switching signal SW<6> having a logic high (H) level, the seventh switching signal SW<7> having a logic high (H) level and the eighth switching signal SW<8> having a logic low (L) level, if the third test signal TM<3> has a logic low (L) level and the fourth test signal TM<4> has a logic high (H) level.

The switching signal generation circuit 10 may generate the fifth switching signal SW<5> having a logic high (H) level, the sixth switching signal SW<6> having a logic high (H) level, the seventh switching signal SW<7> having a logic high (H) level and the eighth switching signal SW<8> having a logic high (H) level, if the third test signal TM<3> has a logic high (H) level and the fourth test signal TM<4> has a logic high (H) level.

Figure 4:
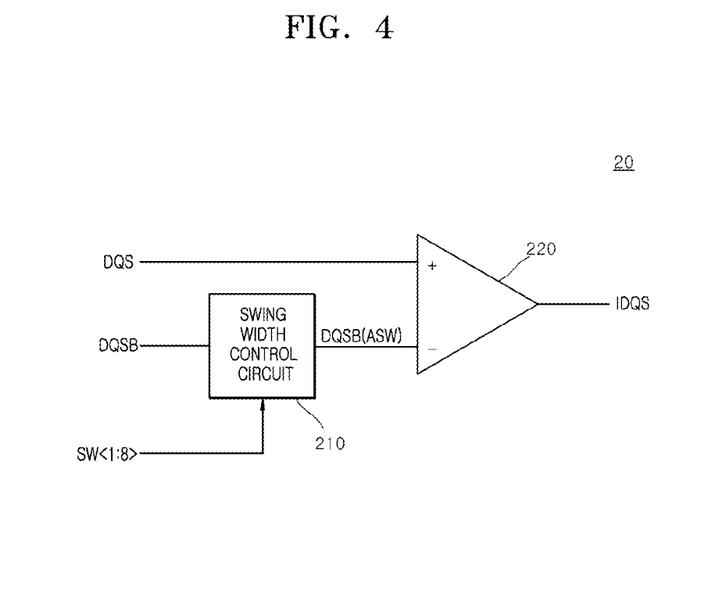
FIG. 4 is a block diagram illustrating an example of a representation of a configuration of an internal strobe signal generation circuit included in the semiconductor system of FIG. 1.

Referring to FIG. 4, the internal strobe signal generation circuit 20 may include a swing width control circuit 210 and a comparison circuit 220.

The swing width control circuit 210 may adjust a resistance value thereof in accordance with a combination of the first to eighth switching signals SW<1:8> and may adjust a level and a swing width of the second strobe signal DQSB according to the adjusted resistance value. The swing width control circuit 210 may be configured to adjust a level and a swing width of the first strobe signal DQS according to the embodiments.

The comparison circuit 220 may compare the first strobe signal DQS with the second strobe signal DQSB having the adjusted swing width DQSB(ASW) to generate the internal strobe signal IDQS. The comparison circuit 220 may be realized using a general comparator. However, in some embodiments, the comparison circuit 220 may be realized using any one of various circuits that compare the first strobe signal DQS with the second strobe signal DQSB having the adjusted swing width DQSB(ASW) to generate the internal strobe signal IDQS.

Figure 5:
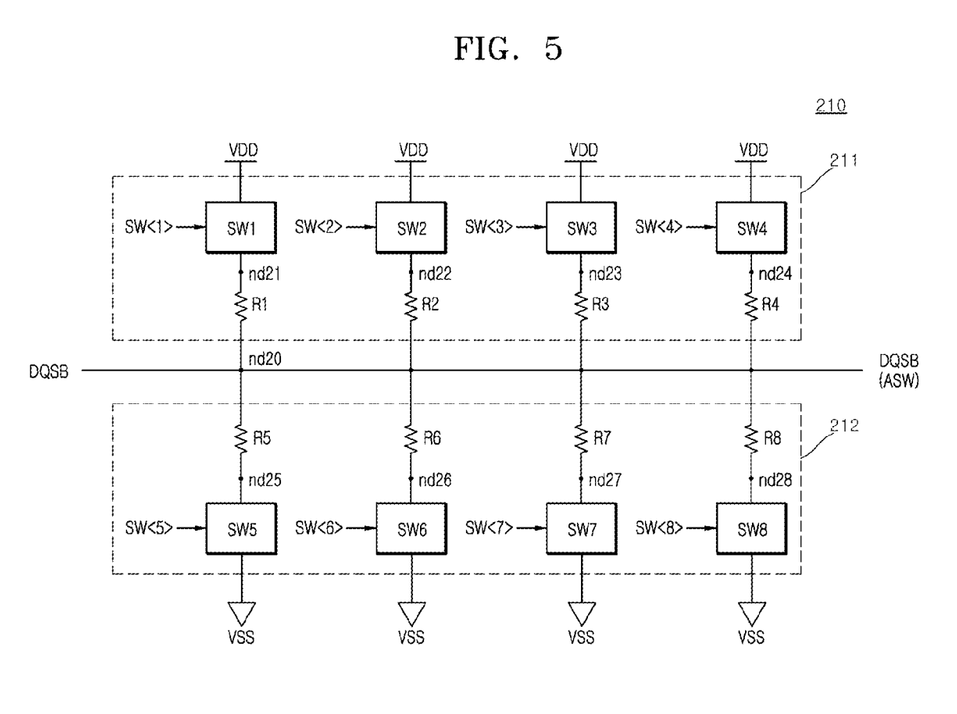
FIG. 5 is a circuit diagram illustrating an example of a representation of a swing width control circuit included in the internal strobe signal generation circuit of FIG. 4.

Referring to FIG. 5, the swing width control circuit 210 may include a first level adjustment circuit 211 and a second level adjustment circuit 212. Further, the logic levels of the signals may be different from or the opposite of those described. For example, a signal described as having a logic "high" level may alternatively have a logic "low" level, and a signal described as having a logic "low" level may alternatively have a logic "high" level The first level adjustment circuit 211 may include a first resistor R1 that is electrically connected between an internal node nd20 to which the second strobe signal DQSB is applied and a first node nd21. The first level adjustment circuit 211 may include a first switch SW1 that is electrically connected between the first node nd21 and a power supply voltage VDD terminal and is turned on if the first switching signal SW<1> is enabled to have a logic high level. The first level adjustment circuit 211 may include a second resistor R2 that is electrically connected between the internal node nd20 and a second node nd22. The first level adjustment circuit 211 may include a second switch SW2 that is electrically connected between the second node nd22 and the power supply voltage VDD terminal and is turned on if the second switching signal SW<2> is enabled to have a logic high level. The first level adjustment circuit 211 may include a third resistor R3 that is electrically connected between the internal node nd20 and a third node nd23, a third switch SW3 that is electrically connected between the third node nd23 and the power supply voltage VDD terminal and is turned on if the third switching signal SW<3> is enabled to have a logic high level. The first level adjustment circuit 211 may include a fourth resistor R4 that is electrically connected between the internal node nd20 and a fourth node nd24, and a fourth switch SW4 that is electrically connected between the fourth node nd24 and the power supply voltage VDD terminal and is turned on if the fourth switching signal SW<4> is enabled to have a logic high level.

The first level adjustment circuit 211 having an aforementioned configuration may adjust a first resistance value thereof by selectively connecting at least one of the first to fourth resistors R1 to R4 in parallel between the power supply voltage VDD terminal and the internal node nd20 in accordance with a combination of the first to fourth switching signals SW<1:4>. The first resistance value may correspond to a resistance value between the power supply voltage VDD terminal and the internal node nd20. The first level adjustment circuit 211 may set an upper limit of a logic high level of the second strobe signal DQSB in accordance with the first resistance value which is set by the combination of the first to fourth switching signals SW<1:4>.

The second level adjustment circuit 212 may include a fifth resistor R5 that is electrically connected between the internal node nd20 to which the second strobe signal DQSB is applied and a fifth node nd25. The second level adjustment circuit 212 may include a fifth switch SW5 that is electrically connected between the fifth node nd25 and a ground voltage VSS terminal and is turned on if the fifth switching signal SW<5> is enabled to have a logic high level. The second level adjustment circuit 212 may include a sixth resistor R6 that is electrically connected between the internal node nd20 and a sixth node nd26. The second level adjustment circuit 212 may include a sixth switch SW6 that is electrically connected between the sixth node nd26 and the ground voltage VSS terminal and is turned on if the sixth switching signal SW<6> is enabled to have a logic high level. The second level adjustment circuit 212 may include a seventh resistor R7 that is electrically connected between the internal node nd20 and a seventh node nd27. The second level adjustment circuit 212 may include a seventh switch SW7 that is electrically connected between the seventh node nd27 and the ground voltage VSS terminal and is turned on if the seventh switching signal SW<7> is enabled to have a logic high level. The second level adjustment circuit 212 may include an eighth resistor R8 that is electrically connected between the internal node nd20 and an eighth node nd28. The second level adjustment circuit 212 may include eighth switch SW8 that is electrically connected between the eighth node nd28 and the ground voltage VSS terminal and is turned on if the eighth switching signal SW<8> is enabled to have a logic high level.

The second level adjustment circuit 212 having an aforementioned configuration may adjust a second resistance value thereof by selectively connecting at least one of the fifth to eighth resistors R5 to R8 in parallel between the internal node nd20 and the ground voltage VSS terminal in accordance with a combination of the fifth to eighth switching signals SW<5:8>. The second resistance value may correspond to a resistance value between the internal node nd20 and the ground voltage VSS terminal. The second level adjustment circuit 212 may set a lower limit of a logic low level of the second strobe signal DQSB in accordance with the second resistance value which is set by the combination of the fifth to eighth switching signals SW<5:8>.

The swing width control circuit 210 having an aforementioned configuration may adjust the level of the second strobe signal DQSB to a predetermined level between the power supply voltage VDD and the ground voltage VSS in accordance with the first and second resistance values which are set in accordance with the combination of the first to eighth switching signals SW<1:8> during the first time period. The swing width control circuit 210 may generate the second strobe signal DQSB having the adjusted swing width DQSB (ASW) of a swing width between the predetermined level and the power supply voltage VDD in accordance with the first and second resistance values which are set by the combination of the first to eighth switching signals SW<1:8> during the second time period. The predetermined level may be determined by dividing the power supply voltage VDD according to the first resistance value and the second resistance value. In addition, the swing width of the second strobe signal DQSB may be determined to be smaller than the swing width of the first strobe signal DQS.

Figure 6:
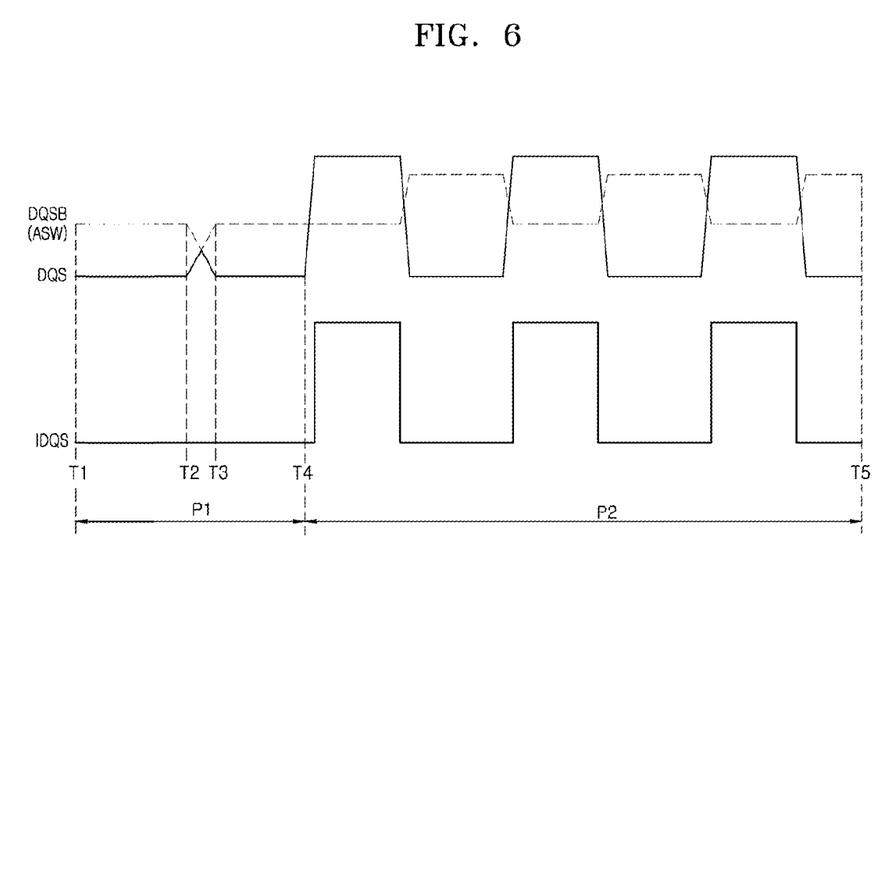
FIG. 6 is a timing diagram illustrating an example of an operation of the semiconductor system illustrated in FIGS. 1 to 5.

A write operation of the semiconductor system according to an embodiment of the present disclosure will be described with reference to FIG. 6 in conjunction with the first time period in which the first strobe signal DQS and the second strobe signal DQSB do not toggle and the second time period in which the first strobe signal DQS and the second strobe signal DQSB toggle. In the following description, it is assumed that levels of the first and second strobe signals DQS and DQSB vary due to noise during the first time period.

First, the first time period in which the first strobe signal DQS and the second strobe signal DQSB do not toggle will be described hereinafter.

In the following description, the first time period may correspond to a time period P1 from a first point of time T1 until a point of time T4 illustrated in FIG. 6.

The first semiconductor device 1 may output the first to fourth test signals TM<1:4>, the first strobe signal DQS, and the second strobe signal DQSB. The first strobe signal DQS and the second strobe signal DQSB may be outputted from the first semiconductor device 1 to have a level of the ground voltage VSS during the first time period P1.

The switching signal generation circuit 10 may decode the first to fourth test signals TM<1:4> to generate the first to eighth switching signals SW<1:8>.

The swing width control circuit 210 of the internal strobe signal generation circuit 20 may adjust a resistance value thereof in accordance with the combination of the first to eighth switching signals SW<1:8> and may adjust the level of the second strobe signal DQSB to a predetermined level in accordance with the adjusted resistance value. The predetermined level may be set to be a level between the ground voltage VSS and the power supply voltage VDD in accordance with the adjusted resistance value.

Even if the levels of the first strobe signal DQS and the second strobe signal DQSB are changed by noise in a time period between a point of time T2 and a point of time T3, it may be possible to prevent a potential difference between the first strobe signal DQS and the second strobe signal DQSB from being reversed.

The comparison circuit 220 of the internal strobe signal generation circuit 20 may compare the first strobe signal DQS with the second strobe signal DQSB having the adjusted swing width DQSB(ASW) to generate the internal strobe signal IDQS having a logic low level.

Next, the second time period in which the first strobe signal DQS and the second strobe signal DQSB toggle will be described hereinafter.

In the following description, the second time period may correspond to a second time period P2 from a point of time T4 until a point of time T5 illustrated in FIG. 6.

The first semiconductor device 1 may output the first to fourth test signals TM<1:4>, the first strobe signal DQS, the second strobe signal DQSB, and the data DQ. The first strobe signal DQS and the second strobe signal DQSB may be outputted as signals which toggle during the second time period P2.

The switching signal generation circuit 10 may decode the first to fourth test signals TM<1:4> to generate the first to eighth switching signals SW<1:8>.

The swing width control circuit 210 of the internal strobe signal generation circuit 20 may adjust a resistance value thereof in accordance with the combination of the first to eighth switching signals SW<1:8> and may adjust the swing width of the second strobe signal DQSB in accordance with the adjusted resistance value. The swing width of the second strobe signal DQSB may be set to have a level difference between the predetermined level corresponding to the level of the second strobe signal DQSB during the first time period P1 and a level of the power supply voltage VDD. The swing width of the second strobe signal DQSB may be set to be smaller than the swing width of the first strobe signal DQS.

The comparison circuit 220 of the internal strobe signal generation circuit 20 may compare the first strobe signal DQS with the second strobe signal DQSB having the adjusted swing width DQSB(ASW) to generate the internal strobe signal IDQS which toggles.

The I/O circuit 30 may latch the data DQ in synchronization with the internal strobe signal IDQS and may output the latched data DQ as the internal data ID.

The internal circuit 40 stores the internal data ID.

The semiconductor system having an aforementioned configuration may adjust a level of any one selected from the strobe signals to a predetermined level during a time period in which the strobe signals corresponding to differential signals do not toggle and may adjust a swing width of the selected one of the strobe signals during another time period in which the strobe signals toggle. Accordingly, it may be possible to prevent the potential difference between the strobe signals from being reversed. The semiconductor system may receive or output the data in synchronization with an internal strobe signal generated from the strobe signals corresponding to differential signals, a potential difference reversal of which is prevented. Accordingly, reliability of the data may be improved.

Figure 7:
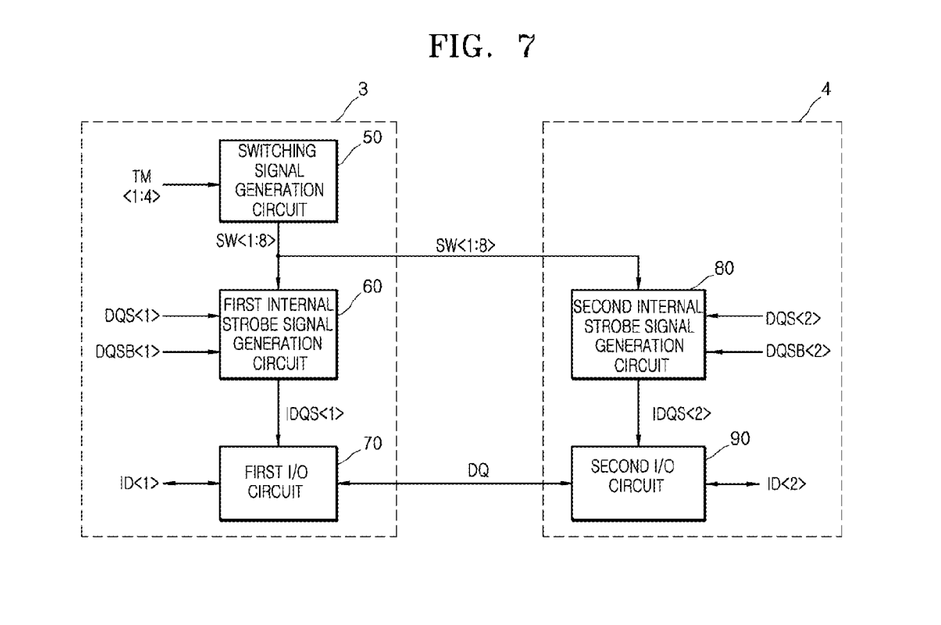
FIG. 7 is a block diagram illustrating an example of a representation of a configuration of a semiconductor system according to an embodiment of the present disclosure.

Referring to FIG. 7, a semiconductor system according to an embodiment of the present disclosure may include a third semiconductor device 3 and a fourth semiconductor device 4. The third semiconductor device 3 may include a switching signal generation circuit 50, a first internal strobe signal generation circuit 60, and a first I/O circuit 70. The fourth semiconductor device 4 may include a second internal strobe signal generation circuit 80 and a second I/O circuit 90.

The switching signal generation circuit 50 may decode first to fourth test signals TM<1:4> to generate first to eighth switching signals SW<1:8>. The first to fourth test signals TM<1:4> may correspond to signals for setting a level and a swing width of a first strobe signal DQS<1> or a second strobe signal DQSB<1>. The first and second test signals TM<1:2> may correspond to signals for setting an upper limit of a logic high level of the first strobe signal DQS<1> or the second strobe signal DQSB<1>. The third and fourth test signals TM<3:4> may correspond to signals for setting a lower limit of a logic low level of the first strobe signal DQS<1> or the second strobe signal DQSB<1>. The switching signal generation circuit 50 may be configured to have the same function as the switching signal generation circuit 10 described with reference to FIGS. 1, 2 and 3. Accordingly, a description of the switching signal generation circuit 50 will be omitted hereinafter.

The first internal strobe signal generation circuit 60 may adjust a level of the first strobe signal DQS<1> or the second strobe signal DQSB<1> to a predetermined level in response to the first to eighth switching signals SW<1:8> during a first time period. The first internal strobe signal generation circuit 60 may adjust a swing width of the first strobe signal DQS<1> or the second strobe signal DQSB<1> in response to the first to eighth switching signals SW<1:8> during a second time period. The internal strobe signal generation circuit 60 may compare the first strobe signal DQS<1> with the second strobe signal DQSB<1> to generate a first internal strobe signal IDQS<1>. The first strobe signal DQS<1> and the second strobe signal DQSB<1> may be set not to toggle during the first time period and may be set to toggle during the second time period. That is, the first time period may be set to be a time period in which the first strobe signal DQS<1> and the second strobe signal DQSB<1> do not toggle, and the second time period may be set to be a time period in which the first strobe signal DQS<1> and the second strobe signal DQSB<1> toggle. The first strobe signal DQS<1> and the second strobe signal DQSB<1> may be set to have opposite phases to each other during the second time period. The first internal strobe signal generation circuit 60 may have the same function as the internal strobe signal generation circuit 20 described with reference to FIGS. 1, 4 and 5. Accordingly, a description of the first internal strobe signal generation circuit 60 will be omitted hereinafter.

The first I/O circuit 70 may latch data DQ to generate first internal data ID<1> in synchronization with a first internal strobe signal IDQS<1> during a write operation of the third semiconductor device 3. The first I/O circuit 70 may latch the first internal data ID<1> to output the latched first internal data as the data DQ in synchronization with the first internal strobe signal IDQS<1> during a read operation of the third semiconductor device 3. The first I/O circuit 70 may be configured to have the same function as the I/O circuit 30 described with reference to FIG. 1. Accordingly, a description of the first I/O circuit 70 will be omitted hereinafter.

The second internal strobe signal generation circuit 80 may adjust a level of a third strobe signal DQS<2> or a fourth strobe signal DQSB<2> to a predetermined level in response to the first to eighth switching signals SW<1:8> during a third time period. The second internal strobe signal generation circuit 80 may adjust a swing width of the third strobe signal DQS<2> or the fourth strobe signal DQSB<2> in response to the first to eighth switching signals SW<1:8> during a fourth time period. The second internal strobe signal generation circuit 80 may compare the third strobe signal DQS<2> with the fourth strobe signal DQSB<2> to generate a second internal strobe signal IDQS<2>. The third strobe signal DQS<2> and the fourth strobe signal DQSB<2> may be set not to toggle during the third time period and may be set to toggle during the fourth time period. The third time period may be set to correspond to a time period in which the third strobe signal DQS<2> and the fourth strobe signal DQSB<2> do not toggle, and the fourth time period may be set to correspond to a time period in which the third strobe signal DQS<2> and the fourth strobe signal DQSB<2> toggle. The third strobe signal DQS<2> and the fourth strobe signal DQSB<2> may be set to have opposite phases to each other during the fourth time period. The second internal strobe signal generation circuit 80 may be configured to have the same function as the internal strobe signal generation circuit 20 described with reference to FIGS. 1, 4 and 5. Accordingly, a description of the second internal strobe signal generation circuit 80 will be omitted hereinafter.

The second I/O circuit 90 may latch the data DQ to generate second internal data ID<2> in synchronization with a second internal strobe signal IDQS<2> during a write operation of the fourth semiconductor device 4. The second I/O circuit 90 may latch the second internal data ID<2> to output the latched second internal data as the data DQ in synchronization with the second internal strobe signal IDQS<2> during a read operation of the fourth semiconductor device 4. The second I/O circuit 90 may be configured to have the same function as the I/O circuit 30 described with reference to FIG. 1. Accordingly, a description of the second I/O circuit 90 will be omitted hereinafter.

Figure 8:
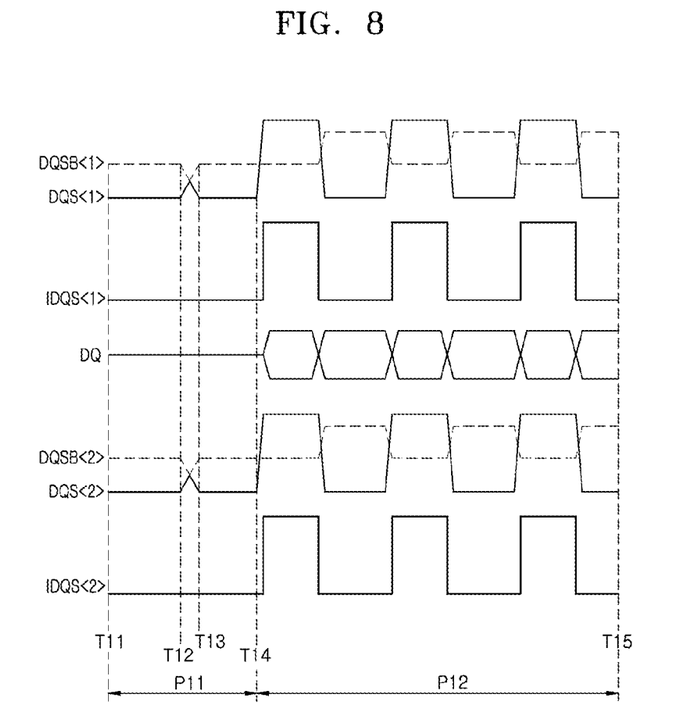
FIG. 8 is a timing diagram illustrating an example of an operation of the semiconductor system illustrated in FIG. 7.

An operation of the semiconductor system illustrated in FIG. 7 will be described hereinafter with reference to FIG. 8 in conjunction with an example in which the third semiconductor device 3 performs a read operation and the fourth semiconductor device 4 performs a write operation. In the following description, the first time period corresponds to a time period in which the first to fourth strobe signals DQS<1>, DQSB<1>, DQS<2> and DQSB<2> do not toggle, and the second time period corresponds to a time period in which the first to fourth strobe signals DQS<1>, DQSB<1>, DQS<2> and DQSB<2> toggle. In the following description, it is assumed that levels of the first to fourth strobe signals DQS<1>, DQSB<1>, DQS<2> and DQSB<2> vary due to noise during the first time period.

First, the first time period in which the first to fourth strobe signals DQS<1>, DQSB<1>, DQS<2> and DQSB<2> do not toggle will be described hereinafter. The first time period may correspond to each of the first time period and the third time period which are described with reference to FIG. 7.

In the following description, the first time period may correspond to a time period P11 from a point of time T11 until a point of time T14 illustrated in FIG. 8.

The third semiconductor device 3 may enter the read operation to generate the first to fourth test signals TM<1:4>, the first and second strobe signals DQS<1> and DQSB<1>, and the first internal data ID<1>. The first strobe signal DQS<1> and the second strobe signal DQSB<1> may be generated to have a level of the ground voltage VSS during the first time period P11.

The switching signal generation circuit 50 may decode the first to fourth test signals TM<1:4> to generate the first to eighth switching signals SW<1:8>.

The first internal strobe signal generation circuit 60 may adjust a resistance value thereof in accordance with a combination of the first to eighth switching signals SW<1:8> and may adjust a level of the second strobe signal DQSB<1> to a predetermined level in accordance with the adjusted resistance value. The predetermined level may be set to be a level between the ground voltage VSS and the power supply voltage VDD in accordance with the adjusted resistance value.

Even if the levels of the first strobe signal DQS<1> and the second strobe signal DQSB<1> are changed by noise in a time period between a point of time T12 and a point of time T13, it may be possible to prevent a potential difference between the first strobe signal DQS<1> and the second strobe signal DQSB<1> from being reversed.

The first internal strobe signal generation circuit 60 may compare the first strobe signal DQS<1> with the second strobe signal DQSB<1> to generate the first internal strobe signal IDQS<1> having a logic low level.

The fourth semiconductor device 4 may enter the write operation to generate the third strobe signal DQS<2> and the fourth strobe signal DQSB<2>. The third strobe signal DQS<2> and the fourth strobe signal DQSB<2> may be generated to have a level of the ground voltage VSS during the first period P11.

The second internal strobe signal generation circuit 80 may adjust a resistance value thereof in accordance with the combination of the first to eighth switching signals SW<1:8> and may adjust a level of the fourth strobe signal DQSB<2> to a predetermined level in accordance with the adjusted resistance value. The predetermined level may be set to be a level between the ground voltage VSS and the power supply voltage VDD in accordance with the adjusted resistance value.

Even if the levels of the third strobe signal DQS<2> and the fourth strobe signal DQSB<2> are changed by noise in a time period between the point of time T12 and the point of time T13, it may be possible to prevent a potential difference between the third strobe signal DQS<2> and the fourth strobe signal DQSB<2> from being reversed.

The second internal strobe signal generation circuit 80 may compare the third strobe signal DQS<2> with the fourth strobe signal DQSB<2> to generate the second internal strobe signal IDQS<2> having a logic low level.

Next, the second time period in which the first to fourth strobe signals DQS<1>, DQSB<1>, DQS<2> and DQSB<2> toggle will be described hereinafter. The second time period may correspond to each of the second time period and the fourth time period which are described with reference to FIG. 7.

In the following description, the second time period may correspond to a time period P12 from a point of time T14 until a point of time T15 illustrated in FIG. 8.

The third semiconductor device 3 may generate the first to fourth test signals TM<1:4>, the first strobe signal DQS<1>, the second strobe signal DQSB<1> and the first internal data ID<1> during the read operation. The first strobe signal DQS<1> and the second strobe signal DQSB<1> may be generated as signals which toggle during the second time period P12.

The switching signal generation circuit 50 may decode the first to fourth test signals TM<1:4> to generate the first to eighth switching signals SW<1:8>.

The first internal strobe signal generation circuit 60 may adjust a resistance value thereof in accordance with the combination of the first to eighth switching signals SW<1:8> and may adjust the swing width of the second strobe signal DQSB<1> in accordance with the adjusted resistance value. The swing width of the second strobe signal DQSB<1> may be set to have a level difference between the predetermined level corresponding to the level of the second strobe signal DQSB<1> during the first time period P11 and a level of the power supply voltage VDD. The swing width of the second strobe signal DQSB<1> may be set to be smaller than the swing width of the first strobe signal DQS<1>.

The first internal strobe signal generation circuit 60 may compare the first strobe signal DQS<1> with the second strobe signal DQSB<1> to generate the first internal strobe signal IDQS<1> which toggles.

The first I/O circuit 70 may latch the first internal data ID<1> in synchronization with the first internal strobe signal IDQS<1> and may output the latched first internal data ID<1> as the data DQ.

The fourth semiconductor device 4 may generate the third strobe signal DQS<2> and the fourth strobe signal DQSB<2> during the write operation. The third strobe signal DQS<2> and the fourth strobe signal DQSB<2> may be generated as signals which toggle during the second time period P12.

The second internal strobe signal generation circuit 80 may adjust a resistance value thereof in accordance with the combination of the first to eighth switching signals SW<1:8> and may adjust a swing width of the fourth strobe signal DQSB<2> in accordance with the adjusted resistance value. The swing width of the fourth strobe signal DQSB<2> may be set to have a level difference between the predetermined level corresponding to the level of the fourth strobe signal DQSB<2> during the first time period P11 and a level of the power supply voltage VDD. The swing width of the fourth strobe signal DQSB<2> may be set to be smaller than the swing width of the third strobe signal DQS<2>.

The second internal strobe signal generation circuit 80 may compare the third strobe signal DQS<2> with the fourth strobe signal DQSB<2> to generate the second internal strobe signal IDQS<2> which toggles.

The second I/O circuit 90 may latch the data DQ in synchronization with the second internal strobe signal IDQS<2> and may generate the second internal data ID<2> from the latched data DQ.

The fourth semiconductor device 4 may store the second internal data ID<2>.

The semiconductor systems having the aforementioned configurations may adjust a level of any one selected from the strobe signals to a predetermined level during a time period in which the strobe signals corresponding to differential signals do not toggle and may adjust a swing width of the selected one of the strobe signals during another time period in which the strobe signals toggle. Accordingly, it may be possible to prevent the potential difference between the strobe signals from being reversed. In addition, the semiconductor system may receive or output the data in synchronization with an internal strobe signal generated from the strobe signals corresponding to differential signals, a potential difference reversal of which is prevented. Accordingly, reliability of the data may be improved.

Figure 9:
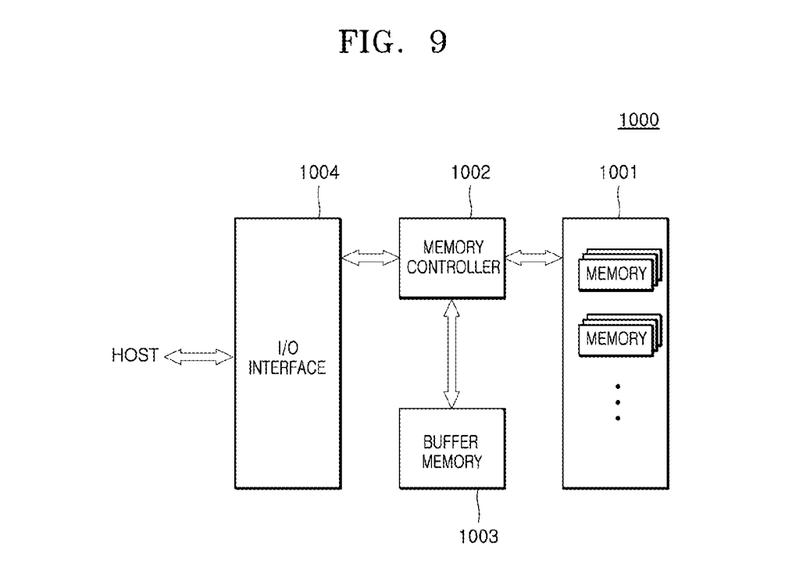
FIG. 9 is a block diagram illustrating an example of a representation of a configuration of an electronic system employing at least one of the semiconductor devices or the semiconductor systems illustrated or associated with FIGS. 1 to 8.

At least one of the semiconductor devices and/or at least one of the semiconductor systems described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor device 2 illustrated in FIG. 1 or the third semiconductor device 3 and the fourth semiconductor device 4 illustrated in FIG. 7. The data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1. Although FIG. 9 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE), etc.

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
   a first semiconductor device configured to output first and second test signals and first and second strobe signals and configured to receive or output data; and
   a second semiconductor device configured to adjust a level of the first strobe signal to a predetermined level in response to the first and second test signals during a first time period, configured to adjust a swing width of the first strobe signal in response to the first and second test signals during a second time period, and configured to receive or output the data in synchronization with an internal strobe signal which is generated by comparing the first strobe signal with the second strobe signal within the second time period.

2. The system of claim 1,
   wherein the second semiconductor device is configured to only toggle the first and second strobe signals during the second time period.

3. The system of claim 1,
   wherein the first test signal is a signal for setting an upper limit of a logic high level of the first strobe signal; and
   wherein the second test signal is a signal for setting a lower limit of a logic low level of the first strobe signal.

4. The system of claim 1, wherein the first strobe signal and the second strobe signal have substantially opposite phases to each other during the second time period.

5. The system of claim 1, wherein lines through which the first strobe signal and the second strobe signal are transmitted are set to have substantially the same loading and trace as a line through which the data are inputted or outputted.

6. The system of claim 1, wherein the second semiconductor device includes:
   a switching signal generation circuit configured to decode the first and second test signals to generate first to fourth switching signals;
   an internal strobe signal generation circuit configured to adjust a level of the first strobe signal in response to the first to fourth switching signals and configured to compare the first strobe signal with the second strobe signal to generate the internal strobe signal; and
   an input and output (I/O) circuit configured to latch the data to generate the internal data in synchronization with the internal strobe signal or configured to latch the internal data to output the latched internal data as the data in synchronization with the internal strobe signal.

7. The system of claim 6, wherein the internal strobe signal generation circuit includes:
   a swing width control circuit configured to adjust a resistance value thereof in accordance with a combination of the first to fourth switching signals and configured to adjust the level and the swing width of the first strobe signal in accordance with the adjusted resistance value; and
   a comparison signal configured to compare the first strobe signal with the adjusted second strobe signal to generate the internal strobe signal.

8. The system of claim 7, wherein the swing width control circuit includes:
   a first level adjustment circuit configured to adjust a first resistance value thereof in accordance with a combination of the first and second switching signals and configured to adjust an upper limit of a logic high level of the first strobe signal in accordance with the adjusted first resistance value; and
   a second level adjustment circuit configured to adjust a second resistance value thereof in accordance with a combination of the third and fourth switching signals and configured to adjust a lower limit of a logic low level of the first strobe signal in accordance with the adjusted second resistance value.

9. The system of claim 8, wherein the first strobe signal toggles in a range between the upper limit and the lower limit during the second time period.

10. The system of claim 8, wherein the first level adjustment circuit adjusts the first resistance value thereof by selectively connecting at least one of a plurality of resistors in parallel between a power supply voltage terminal and an internal node to which the first strobe signal is applied, in response to the first and second switching signals.

11. The system of claim 8, wherein the second level adjustment circuit adjusts the second resistance value thereof by selectively connecting at least one of a plurality of resistors in parallel between an internal node to which the first strobe signal is applied and a ground voltage terminal, in response to the third and fourth switching signals.

12. A semiconductor device comprising:
   an internal strobe signal generation circuit configured to adjust a level of a first strobe signal to a predetermined level in response to first to fourth switching signals during a first time period and configured to compare the first strobe signal with a second strobe signal to generate an internal strobe signal; and
   an input and output (I/O) circuit configured to latch data to generate internal data in synchronization with the internal strobe signal or configured to latch the internal data to output the latched internal data as the data in synchronization with the internal strobe signal.

13. The device of claim 12,
   wherein the semiconductor device is configured to only toggle the first and second strobe signals during the second time period rather than the first time period.

14. The device of claim 12, wherein the first strobe signal and the second strobe signal have substantially opposite phases to each other during the second time period.

15. The device of claim 12, wherein lines through which the first strobe signal and the second strobe signal are transmitted are set to have substantially the same loading and trace as a line through which the data are inputted or outputted.

16. The device of claim 12, wherein the internal strobe signal generation circuit includes:
- a swing width control circuit configured to adjust a resistance value thereof in accordance with a combination of the first to fourth switching signals and configured to adjust the level and a swing width of the first strobe signal in accordance with the adjusted resistance value; and
- a comparison signal configured to compare the first strobe signal with the second strobe signal to generate the internal strobe signal.

17. The device of claim 16, wherein the swing width control circuit includes:
- a first level adjustment circuit configured to adjust a first resistance value thereof in accordance with a combination of the first and second switching signals and configured to adjust an upper limit of a logic high level of the first strobe signal in accordance with the adjusted first resistance value; and
- a second level adjustment circuit configured to adjust a second resistance value thereof in accordance with a combination of the third and fourth switching signals and configured to adjust a lower limit of a logic low level of the first strobe signal in accordance with the adjusted second resistance value.

18. The device of claim 17, wherein the first strobe signal toggles in a range between the upper limit and the lower limit during the second time period.

19. The device of claim 17, wherein the first level adjustment circuit adjusts the first resistance value thereof by selectively connecting at least one of a plurality of resistors in parallel between a power supply voltage terminal and an internal node to which the first strobe signal is applied, in response to the first and second switching signals.

20. The device of claim 17, wherein the second level adjustment circuit adjusts the second resistance value thereof by selectively connecting at least one of a plurality of resistors in parallel between an internal node to which the first strobe signal is applied and a ground voltage terminal, in response to the third and fourth switching signals.

21. A semiconductor system comprising:
- a first semiconductor device configured to adjust a level of a first strobe signal to a predetermined level in response to first to fourth switching signals generated from first and second test signals during a first time period, configured to adjust a swing width of the first strobe signal in response to the first to fourth switching signals during a second time period, and configured to receive or output data in synchronization with a first internal strobe signal which is generated by comparing the first strobe signal with a second strobe signal during the second time period; and
- a second semiconductor device configured to adjust a level of a third strobe signal to a predetermined level in response to the first to fourth switching signals during a third time period, configured to adjust a swing width of the third strobe signal in response to the first to fourth switching signals during a fourth time period, and configured to receive or output the data in synchronization with a second internal strobe signal which is generated by comparing the third strobe signal with a fourth strobe signal during the fourth time period.

22. The system of claim 21,
wherein the first strobe signal and the second strobe signal have substantially opposite phases to each other during the second time period; and
wherein the third strobe signal and the fourth strobe signal have substantially opposite phases to each other during the fourth time period.

* * * * *